(12) United States Patent
Mizutani et al.

(10) Patent No.: US 7,309,264 B2
(45) Date of Patent: Dec. 18, 2007

(54) ELECTRONIC APPARATUS INCLUDING CIRCUIT BOARD CHASSIS

(75) Inventors: Akihiro Mizutani, Nagoya (JP); Satoru Umemoto, Kariya (JP)

(73) Assignee: Denso Corporation (JP)

( * ) Notice: Subject to any disclaimer, the term of this patent is extended or adjusted under 35 U.S.C. 154(b) by 0 days.

(21) Appl. No.: 11/211,088

(22) Filed: Aug. 25, 2005

(65) Prior Publication Data

US 2006/0044768 A1    Mar. 2, 2006

(30) Foreign Application Priority Data

Aug. 26, 2004    (JP) ............................. 2004-247150

(51) Int. Cl.
*H01R 4/36* (2006.01)
(52) U.S. Cl. .................................... 439/810
(58) Field of Classification Search ............... 361/810, 361/818, 715, 718, 728, 730, 751–752, 790, 361/799
See application file for complete search history.

(56) References Cited

U.S. PATENT DOCUMENTS 5,452,183 A * 9/1995 Renn et al. ................. 361/789
6,084,776 A   7/2000 Cuntz et al.
6,108,214 A * 8/2000 Fuse .......................... 361/818
6,111,760 A * 8/2000 Nixon ........................ 361/814
6,118,347 A * 9/2000 Ohira .......................... 331/68

FOREIGN PATENT DOCUMENTS

JP    64-7467       1/1989
JP    10-303590    11/1998

* cited by examiner

*Primary Examiner*—J. F. Duverne
(74) *Attorney, Agent, or Firm*—Nixon & Vanderhye PC

(57) ABSTRACT

The electronic apparatus includes a circuit board on which electronic component is mounted and a chassis housing the circuit board. The chassis is provided with a biasing force applying member applying a biasing force to at least one of top and bottom surfaces of the circuit board to hold the circuit board in position such that the circuit board is allowed to be displaced in a direction parallel to a plane of the circuit board.

11 Claims, 7 Drawing Sheets

DISPLACEMENT DUE TO
TEMPERATURE CHANGE

DISPLACEMENT DUE TO TEMPERATURE CHANGE

ELECTRONIC APPARATUS INCLUDING CIRCUIT BOARD CHASSIS

CROSS-REFERENCE TO RELATED APPLICATION

This application is related to Japanese Patent Application No. 2004-247150 filed on Aug. 26, 2004, the contents of which are hereby incorporated by reference.

BACKGROUND OF THE INVENTION

1. Field of the Invention

The present invention relates to an electronic apparatus including a circuit board chassis.

2. Description of Related Art

As a technique for fixing a circuit board 101 on which an electronic component 100 is mounted to a chassis 102, it is known to use screws 103 as shown in FIG. 11 (refer to U.S. Pat. No. 6,084,776, for example). It is also known to provide the chassis 102 with bent portions 110 by which the circuit board 101 is clamped as shown in FIG. 12. Fixing the circuit board 101 by use of an adhesive 120 as shown in FIG. 13 is also a well known technique.

However, such conventional circuit board fixing techniques have a problem in that the circuit board 101 warps when ambient temperature changes as shown in FIG. 14, because the circuit board 101 is rigidly fixed to the chassis 102. The warp of the circuit board 101 can concentrate stresses in a solder joint of the electronic component 1, and thereby cause cracks in the solder joint.

SUMMARY OF THE INVENTION

The present invention provides an electronic apparatus including:

a circuit board on which an electronic component is mounted; and a chassis housing the circuit board, the chassis being provided with a biasing force applying member applying a biasing force in a direction perpendicular to a plane of the circuit board to at least one of top and bottom surfaces of the circuit board to hold the circuit board in position such that the circuit board is allowed to be displaced in a direction parallel to a plane of the circuit board.

With the present invention, it becomes possible to prevent the circuit board from warping due to thermal expansion or contraction when ambient temperature rises or falls, because the circuit board is held in the chassis by being applied with the biasing force such that the circuit board can be displaced in a direction parallel to the plane of the circuit board.

Accordingly with the present invention, it is possible to avoid a solder joint of the electronic component from being applied with excessive stress due to thermal expansion or contraction of the circuit board, and the electronic component therefore can have a long life.

PREFERRED EMBODIMENTS OF THE INVENTION

First Embodiment

Figure 1:
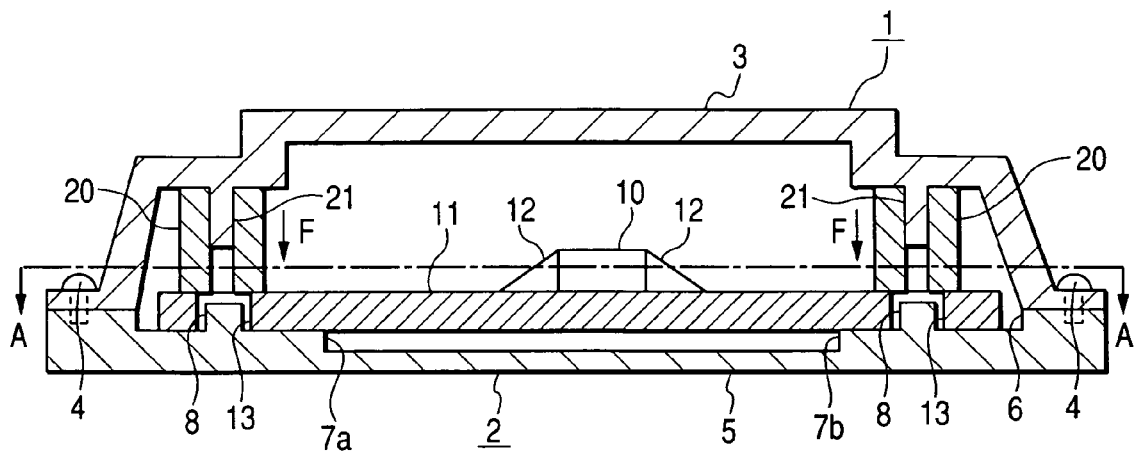
FIG. 1 is a longitudinal cross-sectional view of a chassis of an electronic apparatus according to a first embodiment of the invention.

FIG. 1 is a longitudinal cross-sectional view of a chassis 1 of an electronic apparatus according to a first embodiment of the invention. As shown in this figure, the chassis 1, which is made of metal (iron or aluminum) or resin, includes a lower casing 2 serving as a base plate and an upper casing 3 serving as a cover. The lower casing 2 and the upper casing 3 are secured to each other by screws 4. A circuit board 11 on which an electronic component 10 is mounted by solder is housed in the chassis 1. In FIG. 1, reference numeral 12 denotes a solder joint of the electronic component 10. As a base material of the circuit board 11, a resin may be used. In this embodiment, the thermal expansion coefficient of the chassis 1 is larger than that of the circuit board 11.

Next, the detailed structure of the lower casing 2 is explained below.

Figure 2:
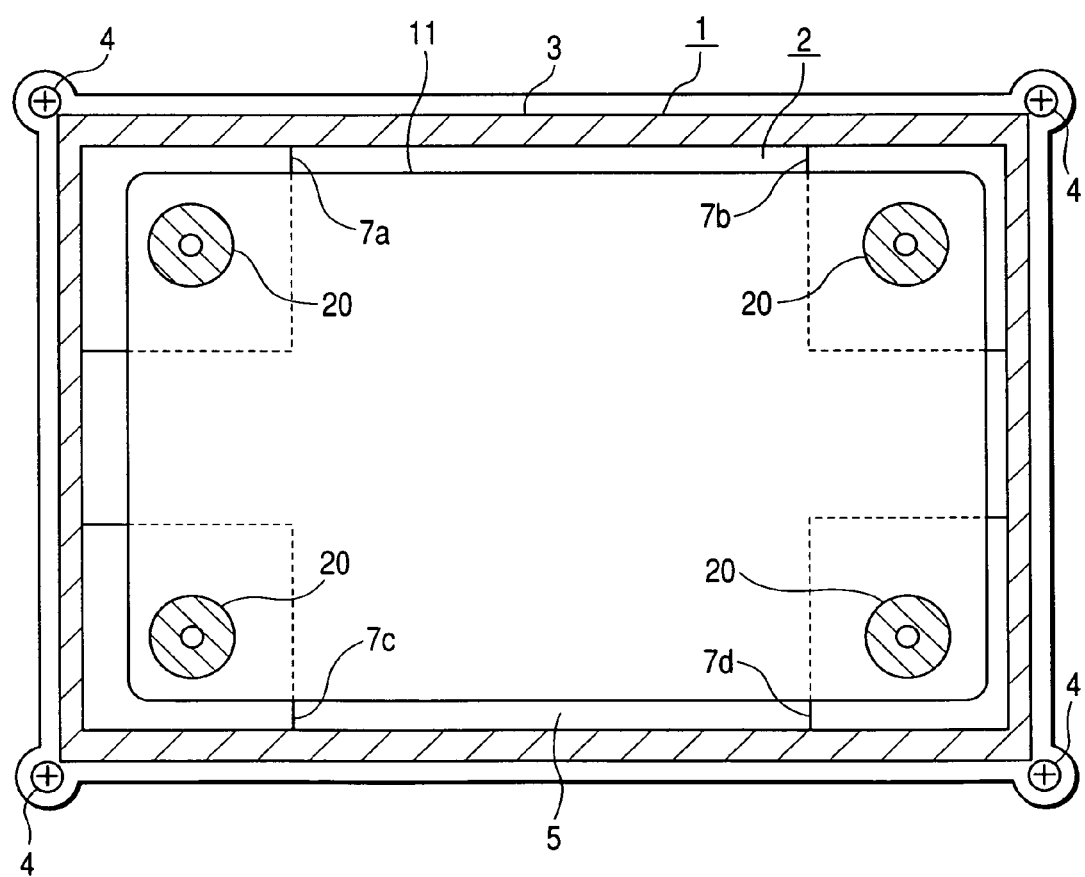
FIG. 2 is a horizontal cross-sectional view of the chassis along the A-A line in FIG. 1.

As shown in FIG. 1 and in FIG. 2 which is a horizontal cross-sectional view of the circuit board chassis 1 along the A-A line in FIG. 1, the lower casing 2 has a rectangular bottom plate 5 that has a raised portion 6 formed along the edge thereof. The upper casing 3 abuts on the surface of the raised portion 6. The bottom plate 5 has also pedestal portions 7a, 7b, 7c, 7d formed at the four corners of the inner surface thereof. The circuit board 11 is placed horizontally on the pedestal portions 7a, 7b, 7c, 7d.

As shown in FIG. 1, each of the pedestal portions 7a, 7b, 7c, 7d is formed with a positioning projection 8 for positioning the circuit board 11 placed on the pedestal portions 7a, 7b, 7c, 7d. The circuit board 11 has four through holes 13 loosely receiving the positioning projections 8 therein. Accordingly, the circuit board 11 can extend and contract in the horizontal direction (any direction parallel to the plane of the circuit board 11). The provision of the positioning projections 8 and the through holes 13 facilitate installing the circuit board 11 in the chassis 1.

The upper casing 3 has a roughly box-like shape whose lower part is open. The opening of the upper casing 3 is closed by the lower casing 2. Four cylindrical elastic members 20 serving as biasing force applying members are provided in a compressed state between the ceiling plane (the inner top surface) of the upper casing 3 and the top surface of the circuit board 11 at positions facing the through holes 13. The bottom surfaces of the cylindrical elastic members 20 are slidable on the top surface of the circuit board 11. The height of the ceiling plane of the upper casing 3 at the positions where the elastic members 20 are provided is made lower than that at other positions so that the elastic members 20 can be made short.

Figure 3:
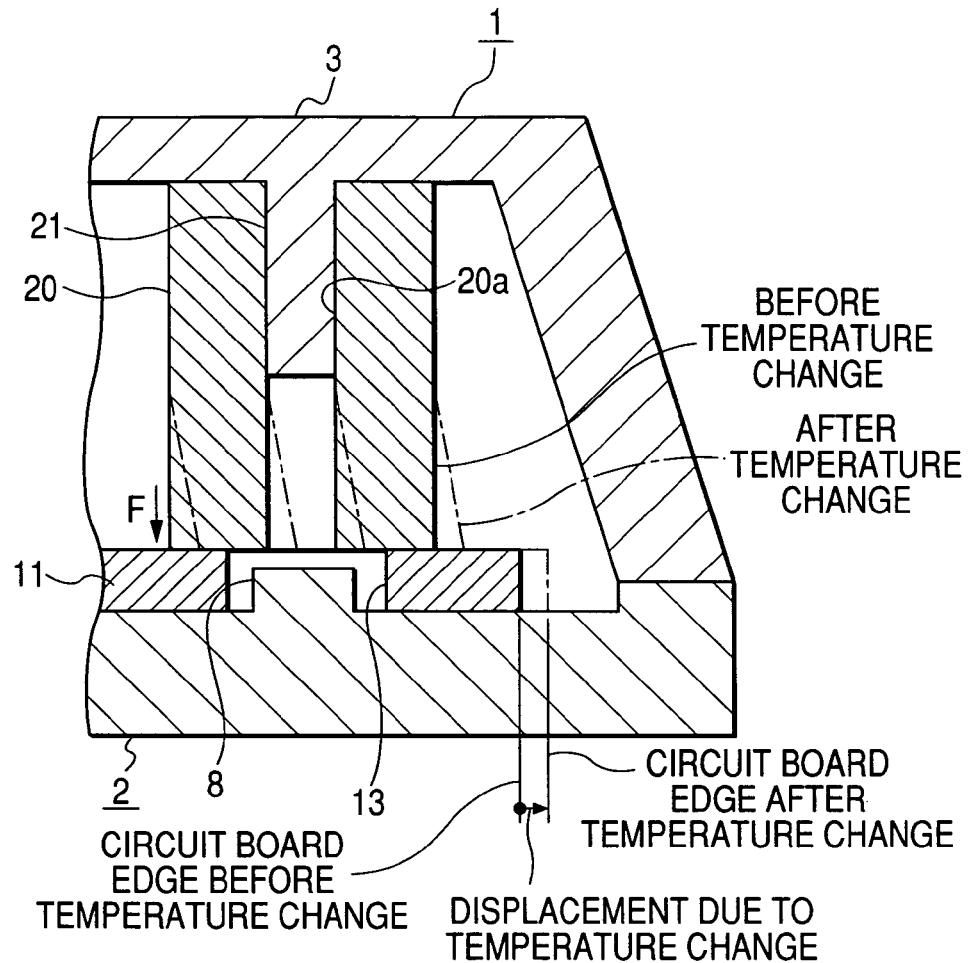
FIG. 3 is a cross-sectional view of a portion of the chassis according to the first embodiment in the vicinity of one of elastic members holding a circuit board.

FIG. 3 is a cross-sectional view of a portion of the chassis 1 in the vicinity of one of the elastic members 20. As shown in this figure, the ceiling plane of the upper casing 3 is formed with a pin 21 projecting downward at each of the corners thereof, and the elastic member 20 has a pin receiving hole 20a formed in its top surface. The elastic member 20 is held by the pin 21 inserted into the pin receiving hole 20a thereof. The vertical center axes of the positioning projection 8 and the pin 20a align to each other, so that the elastic member 20 is situated in a position facing the positioning projection 8. The pin 21 occupies the upper half of the pin receiving hole 20a. The lower half of the pin receiving hole 20a is empty.

The top surface of the elastic member 20 abuts against the ceiling plane of the upper casing 3, and the bottom surface of the elastic member 20a abuts against the top surface of the circuit board 11. Since the elastic member 20 is provided in a vertically compressed state in the chassis 1, the elastic member 20 applies a downward biasing force F to the top surface of the circuit board 11. The length of the elastic member 20 is determined to such a value as to produce a required biasing force.

Thus, the chassis 1 supports the circuit board 11 while applying the downward biasing force F to the top surface of the circuit board 11 and allowing the circuit board 11 to be displaced in the horizontal direction.

The electronic apparatus having the above described chassis 1 may be an electronic control unit for controlling a vehicle engine. In this case, the circuit board 11 is wire-connected to a vehicle battery, various sensors, and engine control actuators such as a fuel injector and an igniter by way of a connector (not shown) fitted in the chassis 1, so that the circuit board 11 can monitor the running state of the vehicle engine on the basis of sensor signals, and perform various logical operations to drive the actuators in order for the engine to run optimally.

When ambient temperature rises, and the circuit board 11 expands in the horizontal direction (the direction parallel to the plane of the circuit board 11) accordingly, the lower half of the elastic member 20 is displaced as shown by the chain lines in FIG. 3. The circuit board 11 can prevent from warping when ambient temperature rises, because the elastic member 20 applying the biasing force F to the circuit board 11 can deform following the thermal expansion of the circuit board 11, which allows the circuit board 11 to expand freely. Accordingly, the solder joint of the electronic component 10 is immune to being applied with excessive stress, and the electronic component 10 therefore has a long life.

Incidentally, in a case where the thermal expansion coefficient of the circuit board 11 is smaller than that of the chassis 1, the present embodiment makes it possible to prevent the circuit board 11 from warping when ambient temperature falls as well.

The present embodiment has also a different advantage that the circuit board 11 can be installed in the chassis 1 without screws, which makes it possible to reduce the production costs, because any screwing process is not needed.

Furthermore, since the elastic members 20 are provided in positions facing the positioning projections 8, reduction of the mounting area in the circuit board 11 due to provision of the elastic members 20 is minimized.

Second Embodiment

Figure 4:
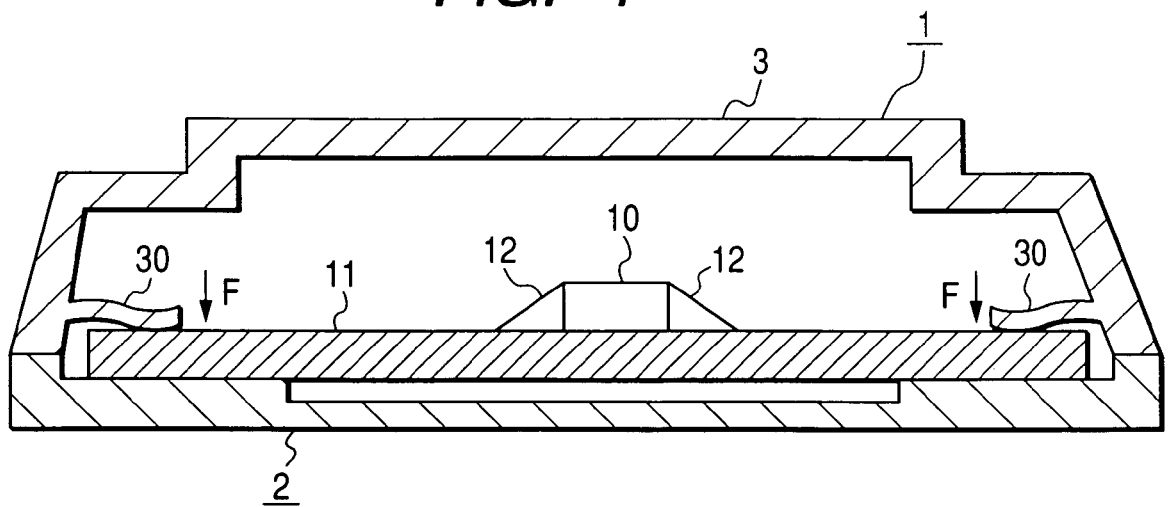
FIG. 4 is a longitudinal cross-sectional view of a chassis of an electronic apparatus according to a second embodiment of the invention.

FIG. 4 is a longitudinal cross-sectional view of a chassis 1 of an electronic apparatus according to a second embodiment of the invention. The second embodiment is different from the first embodiment in that springs 30 are used instead of the elastic members 20.

The spring 30, which may be a blade spring, is formed so as to extend from the inner side surface of the upper casing 3 and abuts on the top surface of the circuit board 11. The spring 30 applies a downward biasing force F to the circuit board 11. The spring 30 can be press-formed in a case where the upper casing 3 is made of steel plate. The spring 30 can be formed integrally with the upper casing 3 in a case where the upper casing 3 is resin-molded. The spring 30 may be formed separately from the upper casing 3.

Third Embodiment

Figure 5:
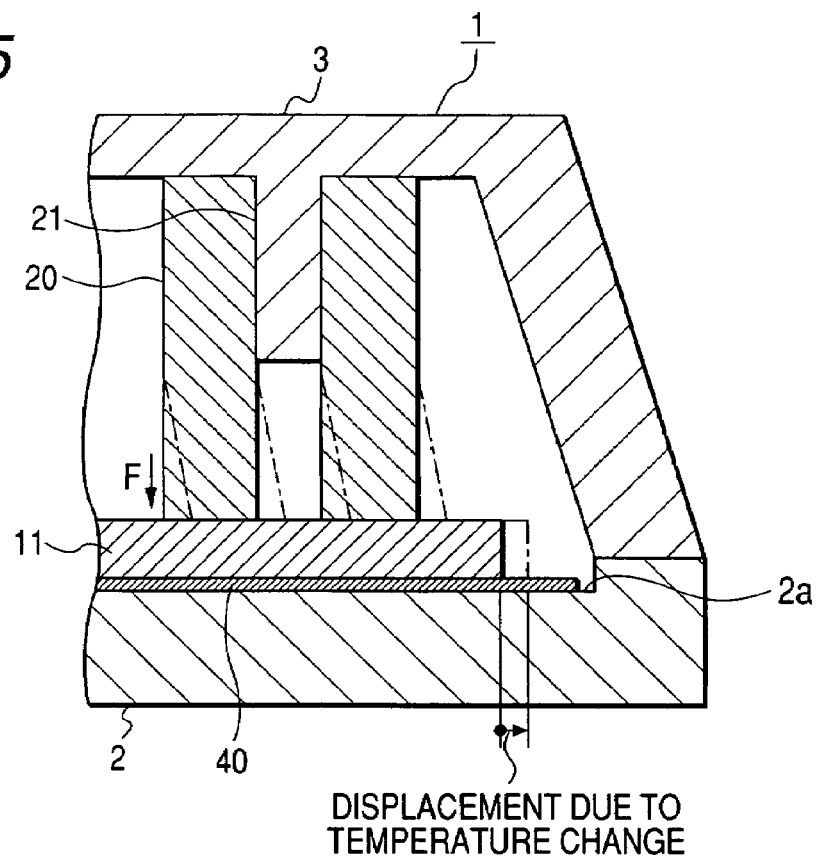
FIG. 5 is a cross-sectional view of a portion of a chassis in the vicinity of one of elastic members holding a circuit board of an electronic apparatus according to a third embodiment of the invention.

FIG. 5 is a cross-sectional view of a portion of a chassis 1 in the vicinity of one of elastic members 20 provided in the chassis 1 of an electronic apparatus according to a third embodiment. The third embodiment is characterized in that a smooth film 40 made of fluorocarbon resin (polytetrafluoroethylene, for example) is provided on the inner surface 2a of the lower casing 2 at areas contacting the bottom surface of the circuit board 11. The friction coefficient of the film 40 is smaller than that of the inner surface 2a of the lower casing 2.

In this embodiment, the circuit board 11 can expand or contract more easily when ambient temperature rises or falls than in the first embodiment. The third embodiment may be configured to have the positioning projections 8 and the through holes 13 as in the case of the first embodiment. The film 40 may be used in the second embodiment.

Fourth Embodiment

Figure 6:
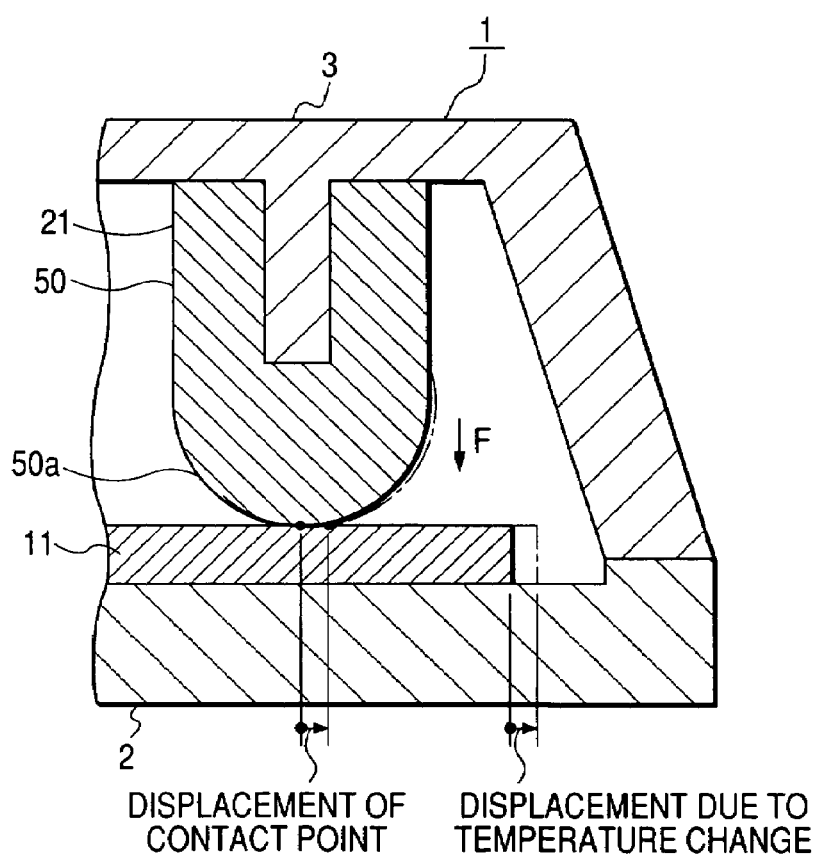
FIG. 6 is a cross-sectional view of a portion of a chassis in the vicinity of one of elastic members holding a circuit board of an electronic apparatus according to a fourth embodiment of the invention.

FIG. 6 is a cross-sectional view of a portion of a chassis 1 in the vicinity of one of elastic members 50 provided in the chassis 1 of an electronic apparatus of a fourth embodiment. In this embodiment, as shown in FIG. 6, although the upper half of the elastic member 50 is made to have a cylindrical shape, the lower half thereof is made to have a semispherical shape, so that the elastic member 50 has a cross-sectional area gradually decreasing toward the circuit board 11 and makes a point-like contact with the top surface of the circuit board 11.

Since the stiffness in the horizontal direction of the elastic member 50 is smaller than that of the elastic member 20 used in the first embodiment, the circuit board 11 can expand or contract more easily than in the first embodiment when ambient temperature rises or falls. The third embodiment may be configured to have the positioning projections 8 and the through holes 13 as in the case of the first embodiment.

Fifth Embodiment

Figure 7:
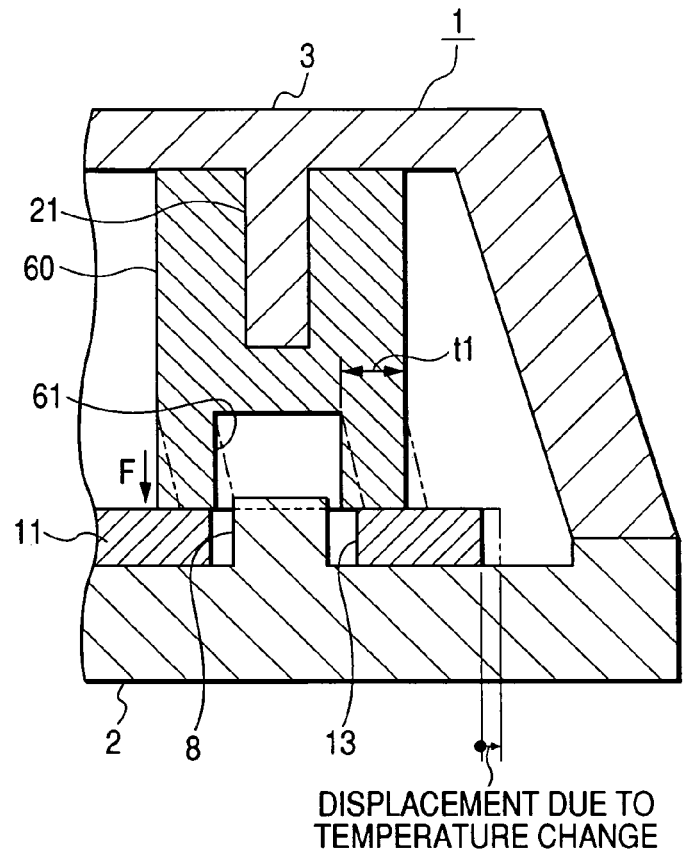
FIG. 7 is a cross-sectional view of a portion of a chassis in the vicinity of one of elastic members holding a circuit board of an electronic apparatus according to a fifth embodiment of the invention.

FIG. 7 is a cross-sectional view of a portion of a chassis 1 in the vicinity of one of elastic members 60 provided in the chassis 1 of an electronic apparatus according to a fifth embodiment. In this embodiment, as shown in FIG. 7, the through hole 13 formed in the circuit board 11 loosely receives the positioning projection 8 formed in the inner surface of the lower casing 2. The vertical center axis of the positioning projection 8 aligns with the vertical center axis of the elastic member 60 as is the case with the first embodiment. in this embodiment, the elastic member 60 having a cylindrical shape and made of a rubber material has a cylindrically drilled recess 61 formed in the bottom surface thereof. The provision of the recess 61 makes it possible to prevent the positioning projection B from interacting with the bottom surface of the elastic member 60 even when the positioning projection 8 slightly juts out from the level of the top surface of the circuit board 11. Furthermore, the circuit board 11 can expand or contract more easily when ambient temperature rises or falls than in the first embodiment, because the elastic member 60 abuts on the top surface of the circuit board 11 by its annular portion defined by the recess 61 having a small wall thickness (t1 in FIG. 7) and having a small stiffness in the horizontal direction.

The elastic member 60 may have such a recess even in a case where the positioning projection 8 and the through hole 13 are not provided.

Sixth Embodiment

Figure 8:
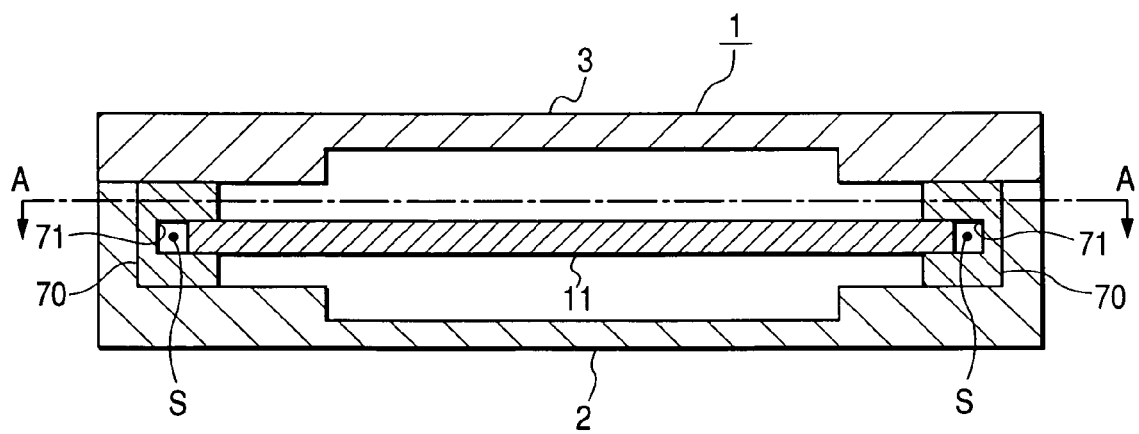
FIG. 8 is a longitudinal cross-sectional view of a chassis of an electronic apparatus according to a sixth embodiment of the invention.
Figure 9:
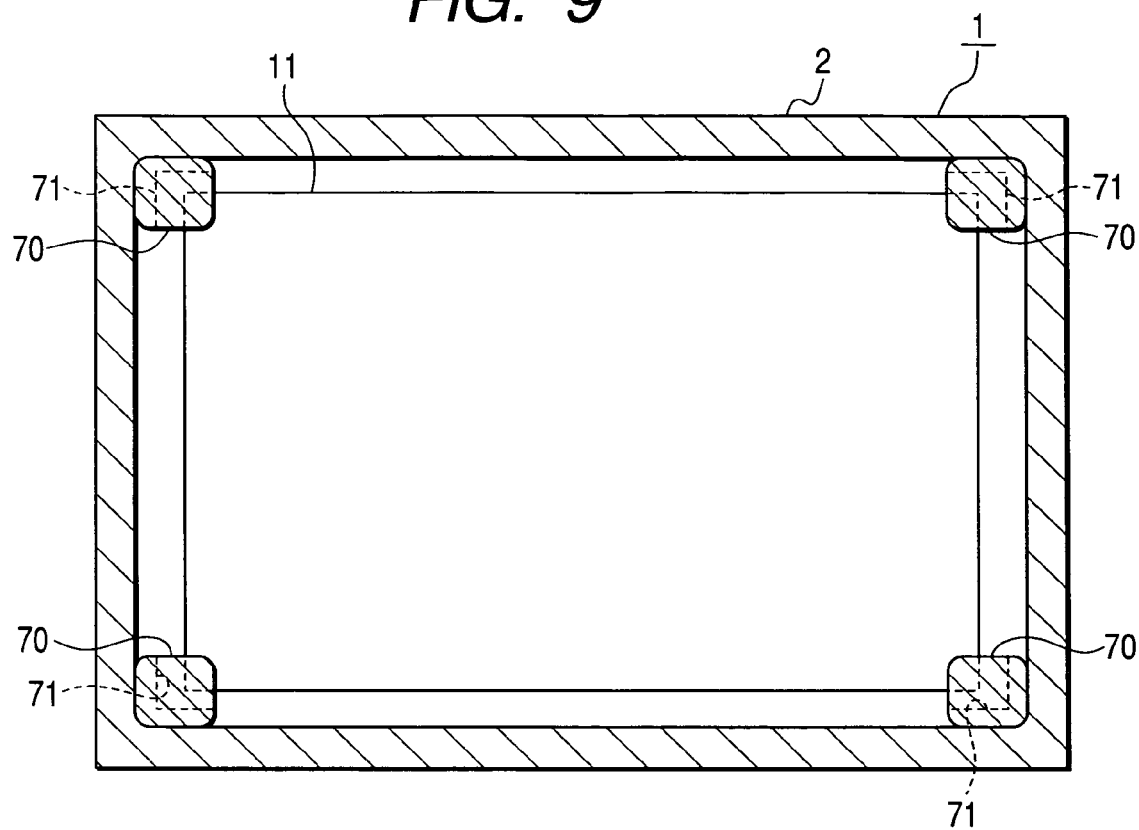
FIG. 9 is a horizontal cross-sectional view of the chassis along the A-A line in FIG. 8.

FIG. 8 is a longitudinal cross-sectional view of a chassis 1 of an electronic apparatus according to a sixth embodiment of the invention. FIG. 9 is a horizontal cross-sectional view of the chassis 1 along the A-A line in FIG. 5.

As shown in these figures, in this embodiment, an elastic member 70 made of a rubber material is provided at each of the four corners of the inside of the lower casing 2. The elastic member 70 has a cutting 71 for receiving therein one of the four corner edges of the circuit board 11.

Figure 10:
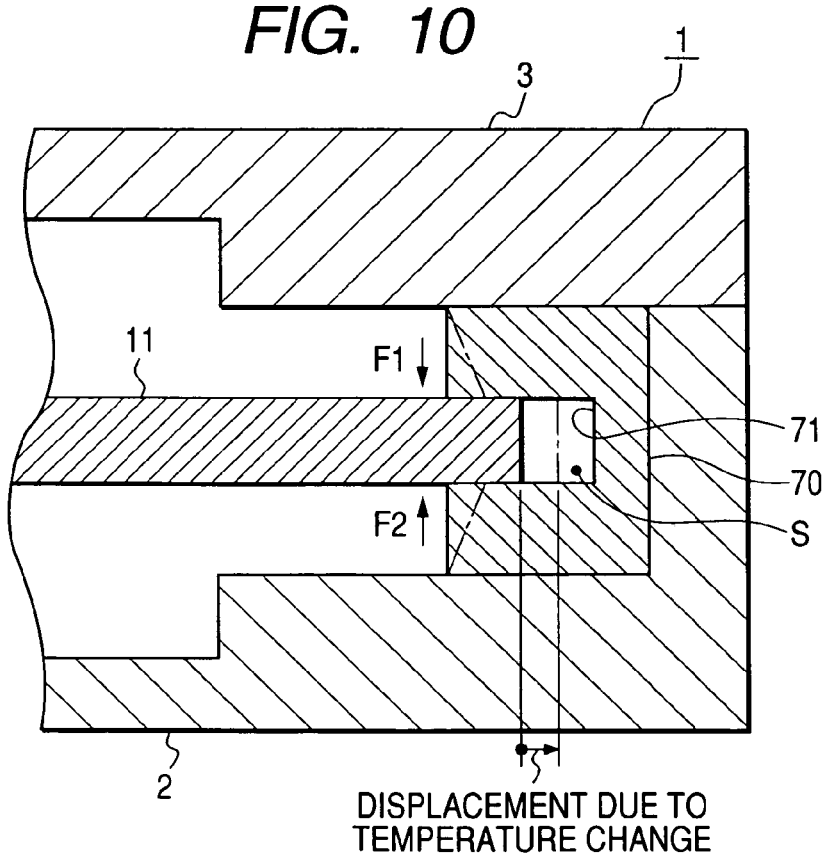
FIG. 10 is a cross-sectional view of a portion of the chassis in the vicinity of one of elastic members holding a circuit board of the electronic apparatus according to the sixth embodiment.
Figure 11:
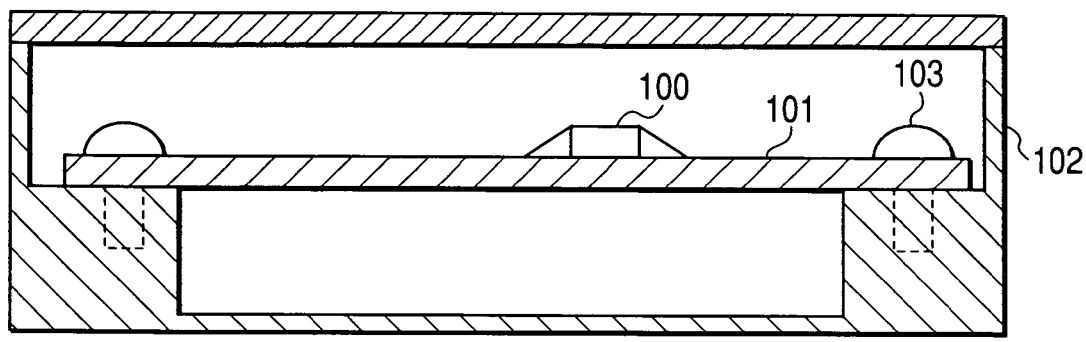
FIGS. 11 to 14 are longitudinal cross-sectional views of chassis of conventional electronic apparatuses.
Figure 12:
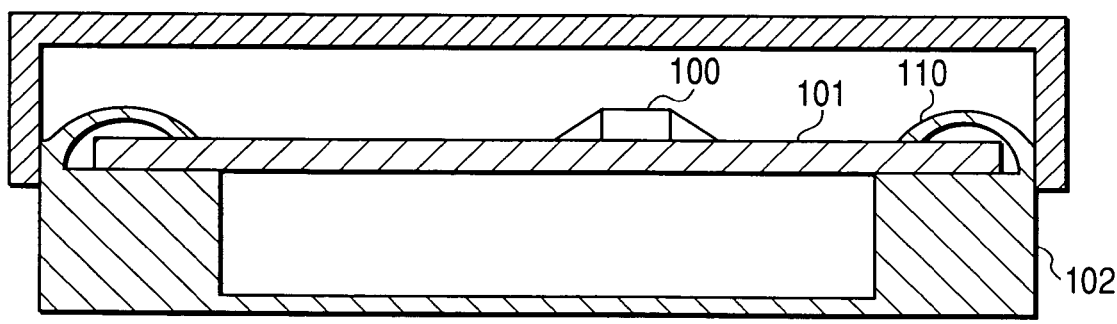
Figure 13:
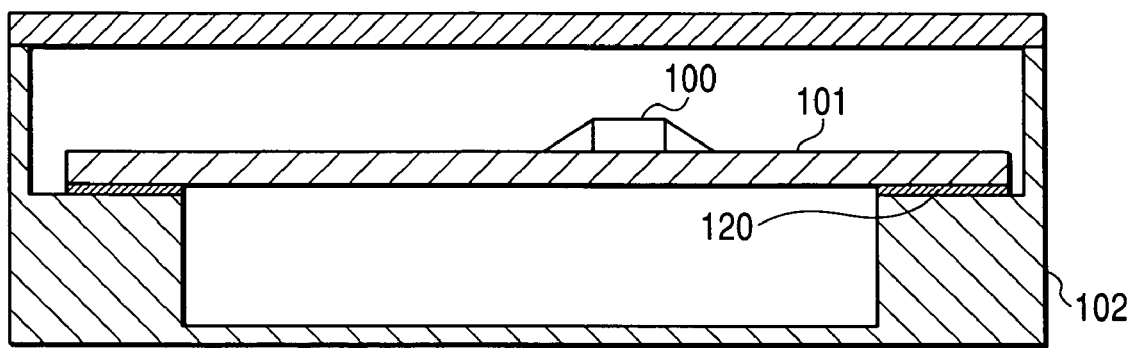
Figure 14:
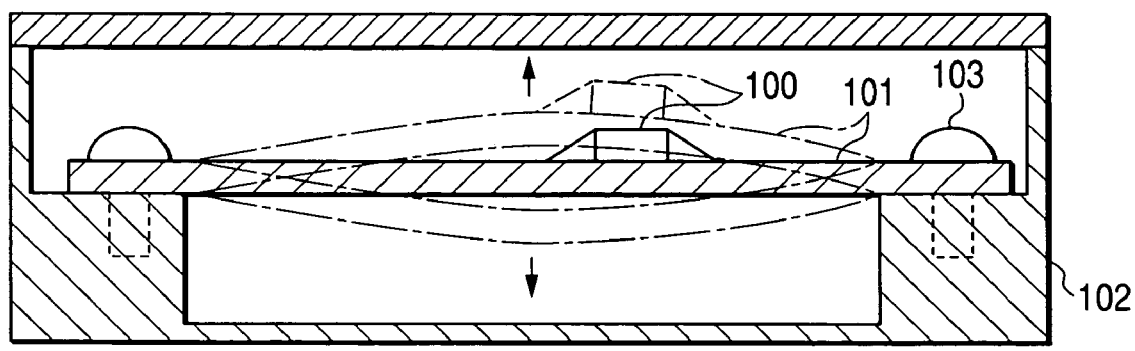

FIG. 10 is a cross-sectional view of a portion of the chassis 1 in the vicinity of one of the elastic members 70. As shown in this figure, the elastic member 70 has such a size that a sufficient clearance S is left within the cutting 71 when the corner edge of the circuit board 11 is inserted into the cutting 71. The elastic member 70, which is held between the upper casing 3 and the lower casing 2 in a compressed state, applies a downward biasing force F1 to the top surface of the circuit board 11 and applies an upward biasing force F2 to the bottom surface of the circuit board 11.

When the circuit board 11 expands or contracts in accordance with ambient temperature change, the elastic member 70 deforms following the expansion or contraction of the circuit board 11. Accordingly, the solder joint of the electronic component 10 is protected from excessive stress, and the electronic component 10 therefore has a long life.

Furthermore, since the elastic member 70 having the cutting 71 also serves as a circuit board mounting member, this embodiment provides cost reduction effect.

The above explained preferred embodiments are exemplary of the invention of the present application which is described solely by the claims appended below. It should be understood that modifications of the preferred embodiments may be made as would occur to one of skill in the art.

What is claimed is:

1. An electronic apparatus comprising:
 a circuit board on which electronic component is mounted; and
 a chassis housing said circuit board,
 said chassis being provided with a biasing force applying member applying a biasing force to at least one of top and bottom surfaces of said circuit board to hold said circuit board in position such that said circuit board is allowed to be displaced
 in a direction parallel to a plane of said circuit board,
 said biasing force applying member is made of a rubber material and is provided, in a compressed state, between said top surface of said circuit board and an inner surface of said chassis, a bottom surface of said rubber material slidably abutting on said top surface of said circuit board, and
 said circuit board is formed with a through hole, and said chassis has a positioning projection formed in said inner surface thereof, said through hole loosely receiving said positioning projection, said bottom surface of said rubber material facing said positioning projection across from said circuit board.

2. The electronic apparatus according to claim 1, wherein, said biasing force is applied to said top surface of said circuit board, and a film is provided on an inner surface of said chassis at a region contacting said bottom surface of said circuit board, said film having a friction coefficient smaller than that of said inner surface of said chassis.

3. The electronic apparatus according to claim 1, wherein said biasing force applying member has a cross-sectional area that gradually decreases toward a tip portion thereof which is in contact with said top surface of said circuit board.

4. The electronic apparatus according to claim 1, wherein said rubber material has a recess formed in said bottom surface thereof.

5. An electronic apparatus comprising:
 a circuit board on which electronic component is mounted; and
 a chassis housing said circuit board,
 said chassis being provided with a biasing force applying member applying a biasing force to at least one of top and bottom surfaces of said circuit board to hold said circuit board in position such that said circuit board is allowed to be displaced
 in a direction parallel to a plane of said circuit board,
 wherein said circuit board is formed with a through hole, and said chassis has a positioning projection formed in said inner surface thereof, said through hole loosely receiving said positioning projection, a bottom surface of said biasing force applying member facing said positioning projection across from said circuit board.

6. The electronic apparatus according to claim 5, wherein said biasing force applying member is made of a rubber material having a cylindrical shape, and is provided, in a compressed state, between said top surface of said circuit board and an inner surface of said chassis, a bottom surface of said rubber material slidably abutting on said top surface of said circuit board.

7. The electronic apparatus according to claim 5, wherein said biasing force applying member is a spring.

8. The electronic apparatus according claim 5, wherein said biasing force applying member is a blade spring.

9. The electronic apparatus according to claim 6, wherein said rubber material has a recess formed in said bottom surface thereof.

10. The electronic apparatus according to claim 5, wherein said biasing force is applied to said top surface of said circuit board, and a film is provided on an inner surface of said chassis at a region contacting said bottom surface of said circuit board, said film having a friction coefficient smaller than that of said inner surface of said chassis.

11. The electronic apparatus according to claim 5, wherein said biasing force applying member is made of a rubber material whose cross-sectional area gradually decreases toward a tip portion thereof which is in contact with said top surface of said circuit board.

* * * * *